US012761401B2

(12) United States Patent
Qiu et al.

(10) Patent No.: US 12,761,401 B2
(45) Date of Patent: Oct. 13, 2026

(54) AUGMENTED REALITY OPTICAL LENS WITH EYE PROTECTION FUNCTION AND PREPARATION METHOD THEREFOR

(71) Applicant: Moldnano (Hangzhou) Technology Co., Ltd., Hangzhou (CN)

(72) Inventors: Min Qiu, Hangzhou (CN); Kaikai Du, Hangzhou (CN); Lu Cai, Hangzhou (CN)

(73) Assignee: Moldnano (Hangzhou) Technology Co., Ltd., Hangzhou (CN)

( * ) Notice: Subject to any disclaimer, the term of this patent is extended or adjusted under 35 U.S.C. 154(b) by 0 days.

(21) Appl. No.: 19/281,650

(22) Filed: Jul. 26, 2025

(65) Prior Publication Data

US 2025/0355141 A1 Nov. 20, 2025

(30) Foreign Application Priority Data

Mar. 3, 2025 (CN) ......................... 202510240666.2

(51) Int. Cl.
*G02B 1/14* (2015.01)
*C23C 14/35* (2006.01)
*G02B 1/11* (2015.01)
*G02B 27/00* (2006.01)

(52) U.S. Cl.
CPC .................. *G02B 1/14* (2015.01); *G02B 1/11* (2013.01); *G02B 27/0012* (2013.01); *C23C 14/35* (2013.01)

(58) Field of Classification Search
CPC .................................... G02B 1/11; G02B 1/14
See application file for complete search history.

(56) References Cited

U.S. PATENT DOCUMENTS

2015/0276987 A1* 10/2015 McKenzie ....... B29D 11/00009 427/10
2021/0397022 A1* 12/2021 Nagatsuka ............. G02C 7/024

FOREIGN PATENT DOCUMENTS

CN 112840262 A 5/2021
CN 116857844 A * 10/2023 ............ F25B 23/003

OTHER PUBLICATIONS

CN116857844, machine translation. (Year: 2023).*
(Continued)

*Primary Examiner* — Robert A Vetere
(74) *Attorney, Agent, or Firm* — Hemisphere Law, PLLC

(57) ABSTRACT

The present disclosure provides an augmented reality optical lens with eye protection function and a preparation method therefor, addressing the issues of heat dissipation and eye protection in head-mounted display devices. The lens uses silicon carbide as a substrate, with specific optical thin-film structures on both sides. When the device generates heat, a heating element is connected to the lens by means of a thermally conductive tape, and the heat is dissipated by utilizing a thermal conductivity of silicon carbide. Heat dissipation is enhanced through heat exchange with air and by regulating a direction of infrared radiation, preventing human eyes from thermal radiation. The present disclosure integrates heat dissipation and eye protection functions, features a simple process and high yield, meets the demands for miniaturization, long battery life, and eye protection in head-mounted devices, enhances user experience, and promotes the development of augmented reality technology devices.

36 Claims, 7 Drawing Sheets

(56) References Cited

OTHER PUBLICATIONS

CNIPA, Notification of First Office Action for Chinese application CN202510240666.2, Apr. 9, 2025.
CNIPA, Notification of Second Office Action for Chinese application CN202510240666.2, May 23, 2025.
CNIPA, Notification to grant patent right for Chinese application CN202510240666.2, Jun. 19, 2025.

* cited by examiner

AUGMENTED REALITY OPTICAL LENS WITH EYE PROTECTION FUNCTION AND PREPARATION METHOD THEREFOR

TECHNICAL FIELD

The present disclosure relates to the technical field of optical technology, in particular to an augmented reality optical lens with eye protection function and a preparation method therefor.

BACKGROUND

In the booming development of mixed reality technology, head-mounted display devices are continuously incorporating more internal electronic components to meet the demand for integrated functions, leading to significant heat accumulation during device operation. Given the direct contact of these devices with human skin, heat dissipation has become a critical challenge, and stringent requirements are imposed on heat dissipation accordingly.

Traditional heat dissipation methods primarily include fan cooling and metal frame/heat sink cooling. Although fan cooling can actively dissipate heat, it significantly increases the volume and weight of the device, and additional power consumption leads to reduced battery life, which contradicts the pursuit of miniaturization and long battery life in head-mounted display devices. Meanwhile, although metal heat sinks can conduct heat, they apply extra loads on the device as additional components, reducing wearing comfort. Furthermore, although metal frames can conduct some heat, they have limited effective convection areas, and direct contact must be avoided to prevent skin burns, significantly compromising their heat dissipation effect.

To address these heat dissipation challenges, silicon carbide lenses are employed in the prior art, utilizing their high thermal conductivity to conduct heat to the lens to expand the heat dissipation area, and regulating thermal radiation and visible light transmittance to improve heat dissipation efficiency (as shown in Patent CN116857844A). However, this solution involves coating both sides of a silicon carbide lens with identical radiation-enhancing thin films, resulting in human eyes being exposed to infrared thermal radiation with an emissivity as high as 60% during prolonged use. Due to the strong penetrative power of infrared radiation, heat accumulation in delicate tissues of the human eye, such as the cornea, can cause irreversible damage. Furthermore, given the frequent use of augmented reality glasses in daily scenarios, they should provide protection against ultraviolet (UV) and blue light. The prior art is short in delivering comprehensive eye protection, failing to meet users' demands for improved device protection and wearing comfort.

Therefore, there is an urgent need for an augmented reality optical lens with eye protection function and a preparation method therefor to solve the problems existing in the prior art.

SUMMARY

Embodiments of the present disclosure provide an augmented reality optical lens with eye protection function and a preparation method therefor, addressing the shortcomings in current heat dissipation technologies for head-mounted display devices, such as silicon carbide lenses capable of dissipating heat but coating identical thin films on both sides causing human eyes to suffer from strong infrared thermal radiation damage, and the lack of UV and blue light blocking functions, which cannot meet the demands for miniaturization, long battery life, and comprehensive eye protection in head-mounted display devices.

The core technology of the present disclosure primarily lies in employing silicon carbide, a material with high thermal conductivity, as a lens for augmented reality glasses, where an optical thin film is deposited on the material's surface to achieve increased infrared emissivity and visible light transmittance, and blue light blocking and thermal radiation direction control designs are also incorporated.

In a first aspect, the present disclosure provides an augmented reality optical lens with eye protection function, including:

a substrate made of silicon carbide material, with optical thin-film structures disposed on both sides of the substrate, respectively; where the optical thin-film structure on a side facing a human eye sequentially includes an infrared radiation layer, an infrared reflection layer, and a low-refractive-index dielectric layer; and the optical thin-film structure on a side facing an environment sequentially includes an infrared reflection layer and an infrared radiation layer; and a thermally conductive tape, with one end thermally connected to a lens, and the other end arranged outside the lens for connecting a heating element; where when a device generates heat, the heating element is connected to the lens by means of the thermally conductive tape, and the heat is distributed across the lens by utilizing a thermal conductivity of silicon carbide for heat exchange and dissipation with surrounding air; and in outdoor conditions, optical thin films are used to regulate a direction of infrared radiation, so that the heat radiates away from the human eye in an atmospheric window band; where the infrared radiation layer facing the environment has an infrared emissivity of above 0.5 in the atmospheric window band, the infrared radiation layer facing the human eye has an infrared emissivity of below 0.6 in the atmospheric window band; both of the infrared radiation layers have a transmittance of above 0.55 in a wavelength range from 455 nm to 700 nm and of no more than 0.7 in a wavelength range from 200 nm to 380 nm, and block over 5% of blue light in a wavelength range from 380 nm to 455 nm; and the atmospheric window band of the infrared reflection layers is between 8 μm and 14 μm.

Further, the infrared reflection layers are made of an optical thin-film material with high transmittance in a visible light range and a reflectivity of above 50% in the atmospheric window band.

Further, the infrared radiation layers adopt a film layer structure with alternating high- and low-refractive-index materials, with a total alternating film layer count ranging from 4 to 100, each layer having a thickness ranging from 10 nm to 500 nm, and a total thickness ranging from 0.2 μm to 5 μm.

Further, the low-refractive-index dielectric layer facing the human eye is made of magnesium fluoride.

Further, the infrared reflection layers are made of indium tin oxide.

Further, the high-refractive-index material of the infrared radiation layer is titanium dioxide or hafnium dioxide, and the low-refractive-index material is silicon dioxide.

Further, the thermally conductive tape is made of graphene or copper tape.

Further, the infrared reflection layer facing the human eye has a thickness of 100 nm, and the infrared reflection layer facing the environment has a thickness of 10 nm.

In a second aspect, the present disclosure provides a preparation method for an augmented reality optical lens with eye protection function, including:

S00, inputting optimization objectives into simulation software, including visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and

S20, depositing materials sequentially on a substrate according to the final design values using a thin film deposition method.

The main contributions and innovative points of the present disclosure are as follows:

1) Protection against infrared thermal radiation: The present disclosure precisely regulates the direction of thermal radiation, utilizing unique optical thin-film structures with differentiated film layers on both sides of the silicon carbide lens. The side facing the human eye effectively blocks heat generated by device operation, directing infrared radiation away from the eye. Compared to the prior art where coating identical films on both sides leads to a 60% emissivity that harms the human eye, the present disclosure significantly reduces the risk of heat accumulation in the human eye, protecting delicate tissues such as the cornea and safeguarding ocular physiological functions.
2) Protection against blue light and UV: The infrared radiation layers of the optical thin films also provide protection against UV and blue light, blocking over 40% of blue light (over 45% for specific structures) in a wavelength range from 380 nm to 455 nm, and controlling UV transmittance to less than 0.5 in a wavelength range from 200 nm to 380 nm, preventing ocular structural degradation and pathological changes, improving visual health, extending daily wearing time of augmented reality glasses, and compensating for the shortcomings of the prior art in eye protection.
3) Efficient passive heat dissipation: By combining a silicon carbide lens with a thermally conductive tape, the present disclosure constructs an efficient heat conduction path, rapidly spreading heat exceeding 60° C. from components to the lens. Utilizing natural convection between the lens and low-temperature air, a stable heat dissipation flow is formed based on aerodynamic and heat exchange principles, improving heat dissipation efficiency and reducing the risk of device thermal damage, lessening reliance on active cooling components such as fans, eliminating increased device volume, weight, and power consumption, and ensuring the compactness, lightness, and prolonged battery life of head-mounted devices.
4) Enhanced thermal radiation heat dissipation: Through precise regulation of infrared radiation in the atmospheric window (8 μm-14 μm) band by the optical thin films, the radiation efficiency of the lens towards the environment is increased, allowing heat to be efficiently discharged to the low-temperature region of outer space (approximately 3 K). Compared to existing heat dissipation technologies with limitations, the present disclosure expands the heat dissipation dimension and improves heat dissipation power, ensuring stable operation of the device under high loads and providing an innovative solution to the heat dissipation challenges of highly integrated functional modules.
5) High visible light transmittance: Through optimized design and meticulous processing of the optical thin-film layers, the present disclosure enhances the transmittance of the lens in the visible light band in a range from 400 nm to 700 nm, ensuring clear images and color fidelity in augmented reality scenarios, improving user visual immersion and interactive experience, and maintaining a leading balance between optical performance and functional integration.
6) Excellent manufacturing process: From the precise design of film layer structure parameters based on software algorithms to the application of mature coating processes such as electron beam evaporation and magnetron sputtering, the present disclosure's solution features a mature process, controllable parameters, and high yield. Moreover, it is suitable for mass production, reducing manufacturing costs, shortening production cycles, accelerating product launch and application, and enhancing market competitiveness.

Details of one or more embodiments of the present disclosure are set forth in the following accompanying drawings and descriptions to make other features, objects, and advantages of the present disclosure more concise and comprehensible.

BRIEF DESCRIPTION OF THE DRAWINGS

The drawings illustrated herein are intended to provide a further understanding of the present disclosure and constitute a part of the present disclosure. The exemplary embodiments and their descriptions are used to explain the present disclosure and do not constitute undue limitations to the present disclosure. In the drawings.

DETAILED DESCRIPTION OF THE EMBODIMENTS

Figure 1:
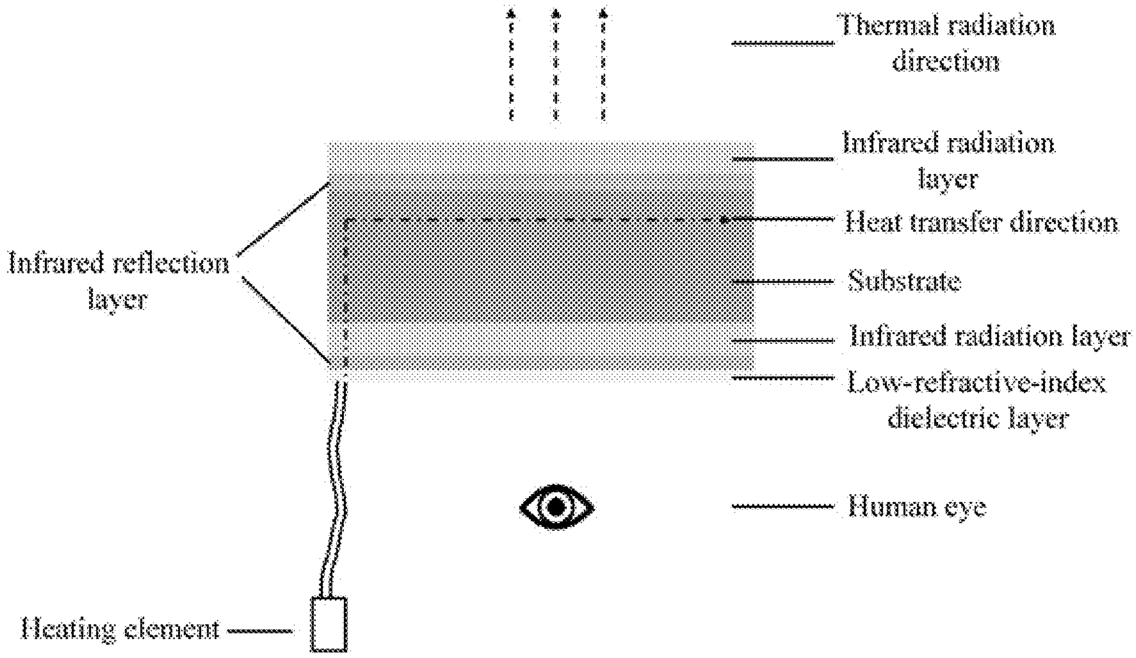
FIG. 1 is a structural schematic diagram of an augmented reality optical lens with eye protection function according to an embodiment of the present disclosure.

The exemplary embodiments will now be described in detail with reference to the accompanying drawings. When referring to the drawings in the following description, unless otherwise indicated, identical numbers in different drawings represent identical or similar elements. The implementations described in the following exemplary embodiments do not represent all implementations consistent with one or more embodiments of this description. Instead, they are merely examples of the device and method consistent with certain aspects of one or more embodiments of this description, as detailed in the appended claims.

It should be noted that the steps of the corresponding method are not necessarily performed in the order shown and described in this description in other embodiments. In some other embodiments, the method may include more or fewer steps than described in this description. Furthermore, individual steps herein may be decomposed into multiple steps in other embodiments; and multiple steps herein may also be combined into a single step in other embodiments.

In the prior art CN116857844A, both sides of a silicon carbide lens are coated with identical radiation-enhancing thin films, which leads to prolonged exposure of a human eye to infrared thermal radiation with an emissivity reaching 60%. Due to the strong penetrative power of infrared radiation and the unique biological structure of the human eye, which differs from that of human skin, the resulting heat accumulation in delicate tissues, such as the cornea, can cause irreversible damage. Additionally, even for augmented reality glasses designed for daily wear, it is essential to incorporate functions for blocking UV and blue light to provide users with enhanced protection and wearing comfort, thereby preventing blue light damage caused by electronic products.

Based on this, the present disclosure provides a new technical solution to address the problems existing in the prior art. The solution of the present disclosure primarily lies in employing silicon carbide, a material with high thermal conductivity, as a lens for augmented reality glasses, where an optical thin film is deposited on the material's surface to achieve increased infrared emissivity and visible light transmittance, and blue light blocking and thermal radiation direction control designs are also incorporated.

Embodiment 1

The present disclosure aims to provide an augmented reality optical lens with eye protection function. Specifically, referring to FIG. 1, the lens includes a substrate, optical thin-film structures, and a thermally conductive tape. The optical thin-film structures are disposed on both sides of the substrate, so that a silicon carbide lens is formed. One end of the thermally conductive tape is adhesively attached to the lens by means of thermally conductive adhesive, and the other end is arranged outside the lens for connecting a heating element.

The specific solution is as follows: When a pair of augmented reality glasses generates heat due to an operation of highly integrated components (usually above 60° C.), the heating element is connected to the silicon carbide lens by means of the thermally conductive tape (generally materials with high thermal conduction efficiency such as graphene or copper tape). Utilizing the ultra-high thermal conductivity of silicon carbide, the heat generated by the electronic components is distributed across the entire lens surface, thereby obtaining a larger convection area for more efficient heat exchange with surrounding lower-temperature air, achieving the purpose of heat dissipation. Simultaneously, in outdoor conditions, the optical thin-film structures deposited on the silicon carbide are used to regulate infrared emissivity, enhancing radiation in an atmospheric window (8 μm-14 μm) band and directing it away from a human eye, so that the heat can be radiated through electromagnetic waves in this band to outer space (3 K) with extremely low temperature. In this way, heat dissipation capability is further improved while the human eye is prevented from prolonged thermal radiation damage. In addition, the optical thin-film structures on the silicon carbide lens can effectively filter blue light, achieving eye protection.

More specifically, as shown in FIG. 1, the silicon carbide lens includes a substrate, infrared reflection layers, infrared radiation layers, and a low-refractive-index dielectric layer. For an interface of the silicon carbide lens facing the human eye, the optical thin-film structure sequentially includes the substrate, the infrared radiation layer, the infrared reflection layer, and the low-refractive-index dielectric layer. For an interface facing an environment, the optical thin-film structure sequentially includes the substrate, the infrared reflection layer, and the infrared radiation layer.

In this embodiment, the infrared reflection layer is an optical thin film with high transmittance in a visible light range and a reflectivity of over 50% in an atmospheric window band. For example, indium tin oxide has the properties of visible light transparency and infrared reflection, making it an excellent infrared reflection layer material, but the present disclosure is not limited to indium tin oxide. Its function is to maintain high transmittance in the visible light range, further increasing the infrared emissivity on the interface facing the environment, while on the interface facing the human eye, the infrared reflection layer arranged outside the infrared radiation layer blocks the heat radiated by infrared to prevent it from radiating to the human eye. The atmospheric window band is in a range from 8 μm to 13 μm.

In this embodiment, the infrared radiation layer facing the environment has an infrared emissivity of above 0.5 in the atmospheric window band, and the infrared radiation layer facing the human eye has an infrared emissivity of below 0.5 in the atmospheric window band. Additionally, both of the infrared radiation layers have a transmittance of above 0.65 in a wavelength range from 455 nm to 700 nm and of no more than 0.5 in a wavelength range from 200 nm to 380 nm, and block over 40% of blue light in a wavelength range from 380 nm to 455 nm, achieving UV and blue light blocking effects. Generally, the infrared radiation layers adopt a film layer structure with alternating high- and low-refractive-index materials, which can satisfy the conditions for optical thin film interference, thus enabling the regulation of transmittance and emissivity. For example, for an anti-reflection film in the present disclosure, by adjusting the thickness of the film layers, this structure can control constructive interference of transmitted light and destructive interference of reflected light, thereby increasing light transmittance. For the infrared radiation layer facing the environment, in addition to meeting the refractive index requirements, the film layer material also needs to exhibit absorption in the atmospheric window band to achieve the purpose of increasing infrared radiation. For example, titanium dioxide, hafnium dioxide, etc., can be used as the high-refractive-index material, and silicon dioxide, etc., can be used as the low-refractive-index material. The low-refractive-index dielectric layer facing the human eye can be made of magnesium fluoride, owing to its low refractive index and lack of enhanced radiation capability in the infrared band.

Preferably, the infrared radiation layers adopt a film layer structure with alternating high- and low-refractive-index materials, with a total alternating film layer count ranging from 4 to 100, each layer having a thickness ranging from 10 nm to 500 nm, and a total thickness ranging from 0.2 μm to 5 μm.

Preferably, the substrate has a thickness ranging from 0.2 mm to 4 mm; a film layer count of the infrared reflection layer is in a range from 1 to 10, each layer having a thickness ranging from 5 nm to 500 nm; a film layer count of the infrared radiation layer is in a range from 4 to 50, each layer having a thickness ranging from 5 nm to 500 nm; and the low-refractive-index dielectric layer has a thickness ranging from 5 nm to 500 nm.

In this embodiment, the infrared reflection layers are made of indium tin oxide, the layer facing the human eye has a thickness of 100 nm, and the layer facing the environment has a thickness of 10 nm; the infrared radiation layers adopt silicon dioxide and hafnium dioxide as low- and high-refractive-index materials, respectively; and the low-refractive-index dielectric layer is made of magnesium fluoride. The film layer structure and thickness from the environment to the human eye are shown in Table 1 below (used to show the specific film system structure in the specific embodiment, including the thickness and material of each layer):

TABLE 1

| Material | Thickness |
|---|---|
| $SiO_2$ | 84.23 nm |
| $HfO_2$ | 101.75 nm |
| $SiO_2$ | 192.35 nm |
| $HfO_2$ | 166.72 nm |
| $SiO_2$ | 207.36 nm |
| $HfO_2$ | 143.42 nm |
| $SiO_2$ | 163.02 nm |
| $HfO_2$ | 150.33 nm |
| $SiO_2$ | 55.45 nm |
| $HfO_2$ | 76.62 nm |
| ITO | 10 nm |
| SiC (Substrate) | 500 μm |
| $HfO_2$ | 85.4 nm |
| $SiO_2$ | 56.47 nm |
| $HfO_2$ | 163.82 nm |
| $SiO_2$ | 209.45 nm |
| $HfO_2$ | 57.33 nm |
| $SiO_2$ | 207.29 nm |
| $HfO_2$ | 130.87 nm |
| ITO | 100 nm |
| $MgF_2$ | 98.96 nm |

Figure 2:
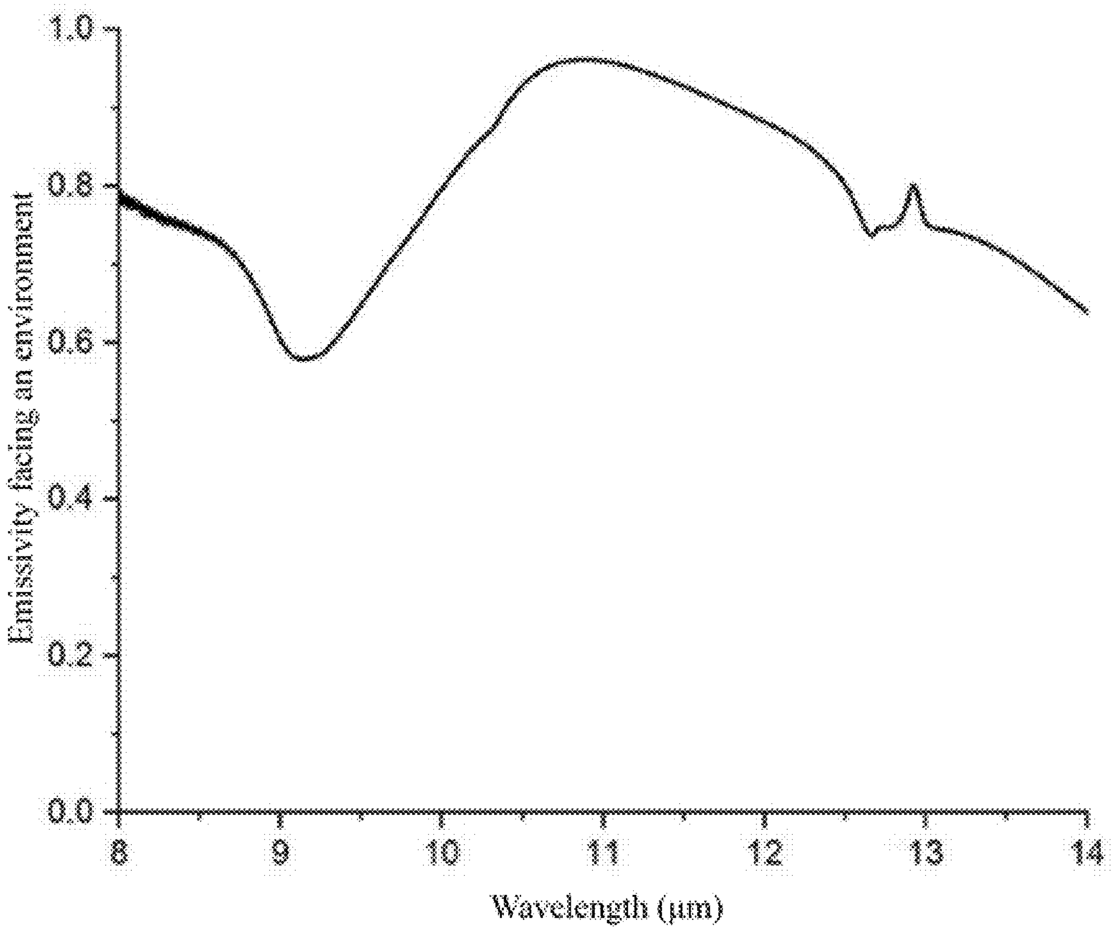
FIG. 2 is a curve diagram of an infrared emissivity of a side facing an environment of an augmented reality optical lens with eye protection function according to an embodiment of the present disclosure.
Figure 3:
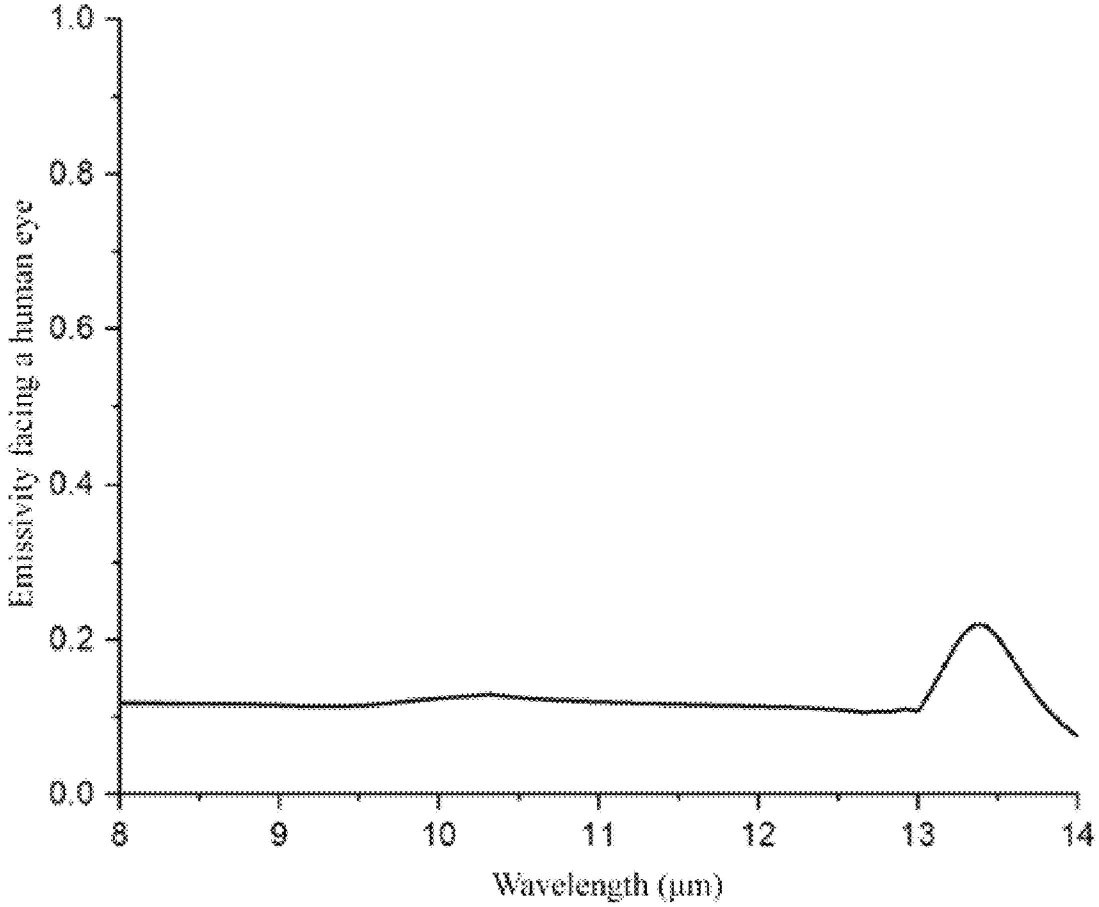
FIG. 3 is a curve diagram of an infrared emissivity of a side facing a human eye of an augmented reality optical lens with eye protection function according to an embodiment of the present disclosure.
Figure 4:
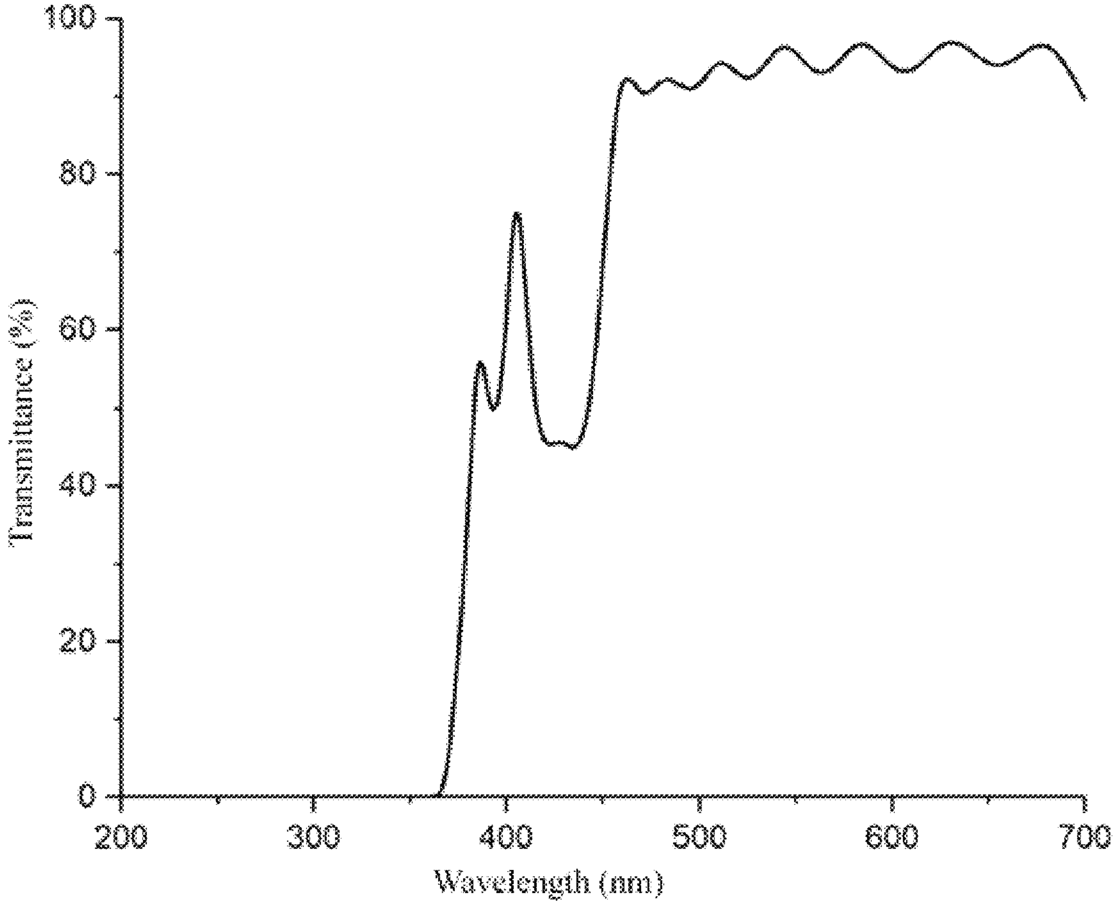
FIG. 4 is a curve diagram of a transmittance of simulated visible light according to an embodiment of the present disclosure.
Figure 5:
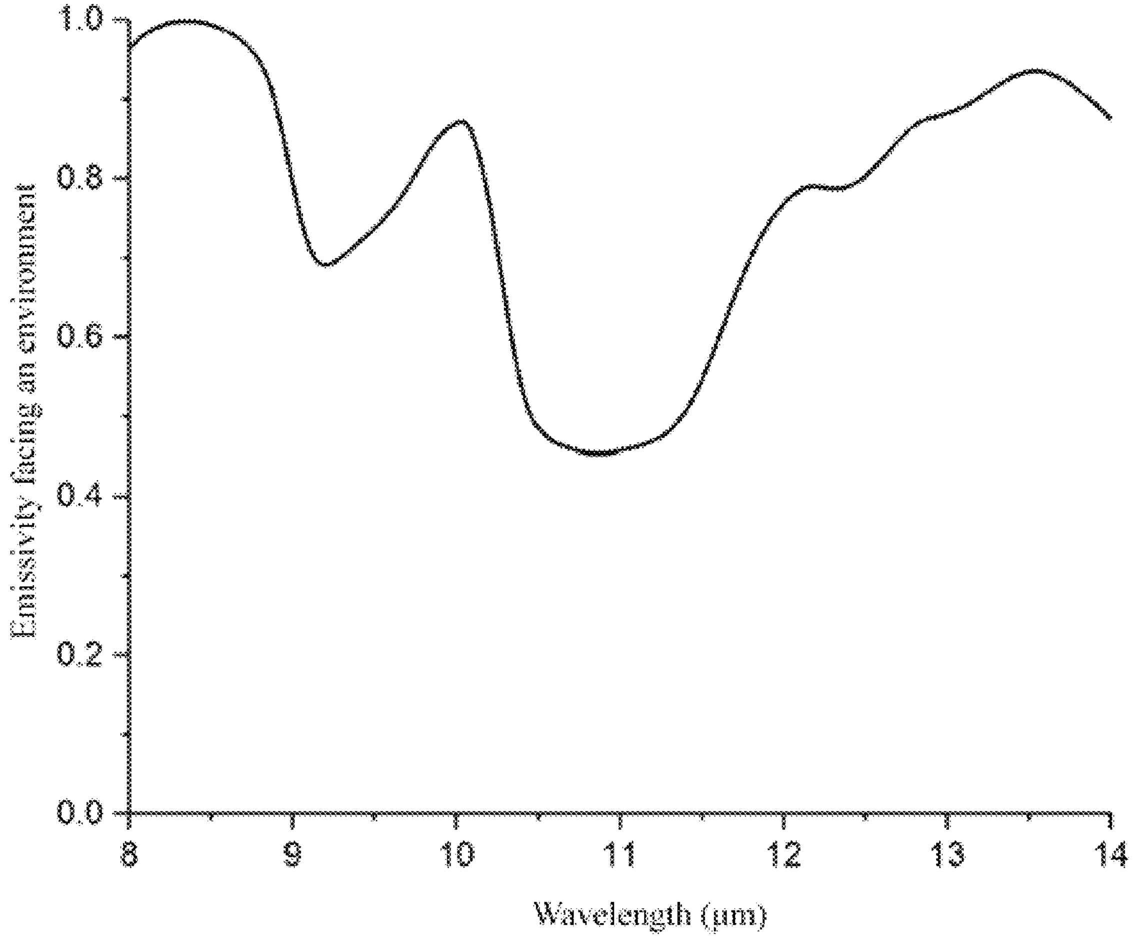
FIG. 5 is a curve diagram of an infrared emissivity of a side facing an environment obtained through actual measurement according to an embodiment of the present disclosure.
Figure 6:
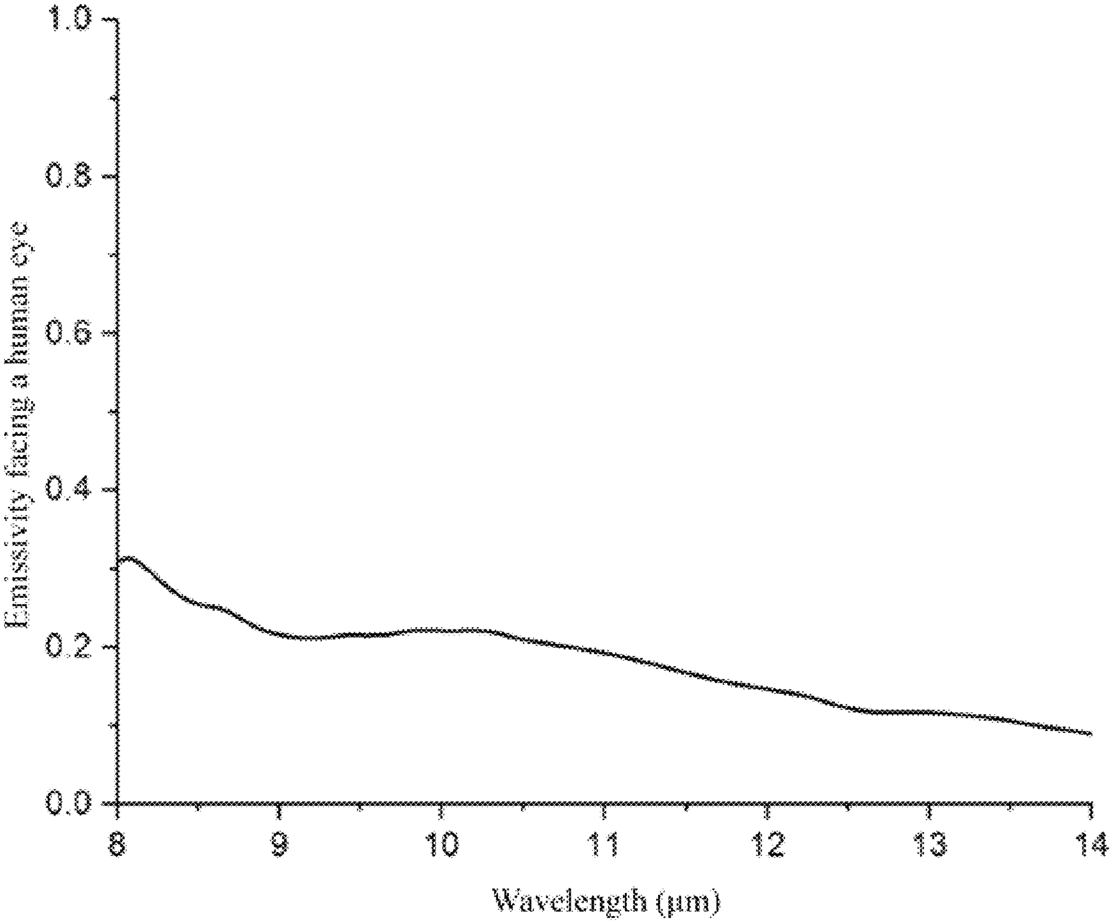
FIG. 6 is a curve diagram of an infrared emissivity of a side facing a human eye obtained through actual measurement according to an embodiment of the present disclosure.
Figure 7:
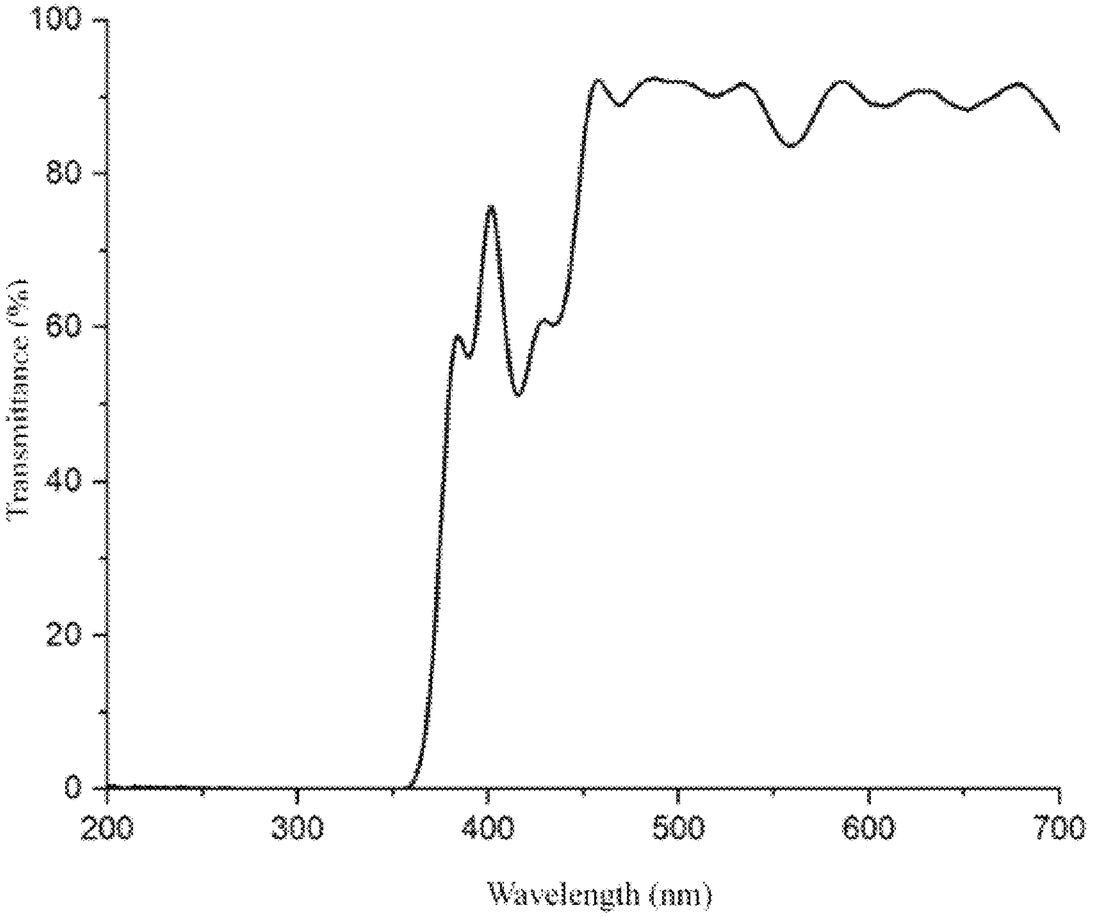
FIG. 7 is a curve diagram of a transmittance of visible light obtained through actual measurement according to an embodiment of the present disclosure.

The anti-radiation functional characteristics achieved by the structure of the present disclosure are shown in FIG. 2 and FIG. 3, which illustrate the emissivity of optical thin-film structures facing the environment and the human eye, respectively. The functional characteristics of UV and blue light blocking achieved by the present disclosure have been calculated. According to measurements, the transmittance in a wavelength range from 200 nm to 380 nm is less than 0.37, and 45% of harmful blue light is effectively blocked in a blue light wavelength range from 380 nm to 455 nm. FIG. 4 is a curve diagram of a transmittance of simulated visible light; FIG. 5 is a curve diagram of an infrared emissivity of the side facing the environment obtained through actual measurement; FIG. 6 is a curve diagram of an infrared emissivity of a side facing the human eye obtained through actual measurement; and FIG. 7 is a curve diagram of a transmittance of visible light obtained through actual measurement.

Embodiment 2

Based on the same inventive concept, the present disclosure also provides a preparation method for an augmented reality optical lens with eye protection function, including:

S00, inputting optimization objectives into simulation software, including visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and

S20, depositing materials sequentially on a substrate according to the final design values using a thin film deposition method.

Preferably, the materials are sequentially deposited on the substrate according to the final design values through electron beam evaporation coating or magnetron sputtering coating.

Those skilled in the art should understand that the technical features of the above embodiments can be combined arbitrarily. For the sake of conciseness, not all possible combinations of the technical features in the above embodiments have been described. However, as long as the combinations of these technical features do not conflict, they should be considered within the scope described in this description.

The above embodiments only express several implementations of the present disclosure. Although they are described in a specific and detailed manner, they should not be construed as limiting the scope of the present disclosure. It should be noted that those skilled in the art can make multiple modifications and improvements without departing from the inventive concept of the present disclosure, and these all fall within the protection scope of the present disclosure. Therefore, the protection scope of the present disclosure should be subject to the appended claims.

The invention claimed is:

1. An augmented reality optical-lens device with eye protection function, comprising:

a lens which comprises a substrate made of silicon carbide material, with optical thin-film structures disposed on both sides of the substrate, respectively; wherein the optical thin-film structure on a side facing a human eye sequentially comprises an infrared radiation layer, an infrared reflection layer, and a low-refractive-index dielectric layer; and the optical thin-film structure on a side facing an environment sequentially comprises an infrared reflection layer and an infrared radiation layer; and a thermally conductive tape, with one end thermally connected to the lens, and the other end arranged outside the lens and connecting at least one heating element in the device; wherein when the at least one heating element in the device generates heat, the heat is distributed across the lens by utilizing a thermal conductivity of silicon carbide for heat exchange and dissipation with surrounding air; and in outdoor conditions, optical thin films are used to regulate a direction of infrared radiation, so that the heat radiates away from the human eye in an atmospheric window band; wherein the infrared radiation layer facing the environment has an infrared emissivity of above 0.5 in the atmospheric window band, the infrared radiation layer facing the human eye has an infrared emissivity of below 0.6 in the atmospheric window band; both of the infrared radiation layers have a transmittance of above 0.55 in a wavelength range from 455 nm to 700 nm and of no more than 0.7 in a wavelength range from 200 nm to 380 nm, and block over 5% of blue light in a wavelength range from 380 nm to 455 nm; the atmospheric window band of the infrared reflection layers is between 8 μm and 14 μm, and the infrared reflection layers are made of an optical thin-film material with high transmittance in a visible light range and a reflectivity of above 50% in the atmospheric window band.

2. The augmented reality optical lens with eye protection function according to claim 1, wherein a thickness of the substrate is in a range from 0.2 mm to 4 mm.

3. The augmented reality optical lens with eye protection function according to claim 2, wherein the infrared radiation layers adopt a film layer structure with alternating high- and low-refractive-index materials, the high-refractive-index material is titanium dioxide or hafnium dioxide, and the low-refractive-index material is silicon dioxide, with a total alternating film layer count ranging from 4 to 50 and each layer having a thickness ranging from 5 nm to 500 nm.

4. The augmented reality optical lens with eye protection function according to claim 3, wherein the infrared reflection layer facing the human eye has a thickness of 100 nm, and the infrared reflection layer facing the environment has a thickness of 10 nm.

5. A preparation method for an augmented reality optical lens with eye protection function according to claim 4, comprising:

- S00, inputting optimization objectives into simulation software, comprising visible light transmittance and infrared emissivity;
- S10, inputting an initial structure, establishing a model of a lens, optimizing a thickness of each layer using the simulation software to obtain a final optimized thickness of each layer of the lens, thereby obtaining final design values; and
- S20, depositing materials sequentially on a substrate according to the final design values using a thin film deposition method.

6. The preparation method according to claim 5, wherein the materials are sequentially deposited on the substrate according to the final design values through electron beam evaporation coating or magnetron sputtering coating.

7. A preparation method for an augmented reality optical lens with eye protection function according to claim 3, comprising:

- S00, inputting optimization objectives into simulation software, comprising visible light transmittance and infrared emissivity;
- S10, inputting an initial structure, establishing a model of a lens, optimizing a thickness of each layer using the simulation software to obtain a final optimized thickness of each layer of the lens, thereby obtaining final design values; and
- S20, depositing materials sequentially on a substrate according to the final design values using a thin film deposition method.

8. The preparation method according to claim 7, wherein the materials are sequentially deposited on the substrate according to the final design values through electron beam evaporation coating or magnetron sputtering coating.

9. The augmented reality optical lens with eye protection function according to claim 2, wherein the infrared reflection layer facing the human eye has a thickness of 100 nm, and the infrared reflection layer facing the environment has a thickness of 10 nm.

10. A preparation method for an augmented reality optical lens with eye protection function according to claim 9, comprising:

- S00, inputting optimization objectives into simulation software, comprising visible light transmittance and infrared emissivity;
- S10, inputting an initial structure, establishing a model of a lens, optimizing a thickness of each layer using the simulation software to obtain a final optimized thickness of each layer of the lens, thereby obtaining final design values; and
- S20, depositing materials sequentially on a substrate according to the final design values using a thin film deposition method.

11. The preparation method according to claim 10, wherein the materials are sequentially deposited on the substrate according to the final design values through electron beam evaporation coating or magnetron sputtering coating.

12. A preparation method for an augmented reality optical lens with eye protection function according to claim 2, comprising:

- S00, inputting optimization objectives into simulation software, comprising visible light transmittance and infrared emissivity;
- S10, inputting an initial structure, establishing a model of a lens, optimizing a thickness of each layer using the simulation software to obtain a final optimized thickness of each layer of the lens, thereby obtaining final design values; and
- S20, depositing materials sequentially on a substrate according to the final design values using a thin film deposition method.

13. The preparation method according to claim 12, wherein the materials are sequentially deposited on the substrate according to the final design values through electron beam evaporation coating or magnetron sputtering coating.

14. The augmented reality optical lens with eye protection function according to claim 1, wherein the low-refractive-index dielectric layer facing the human eye is made of magnesium fluoride with a thickness ranging from 5 nm to 500 nm.

15. The augmented reality optical lens with eye protection function according to claim 14, wherein the infrared reflection layer facing the human eye has a thickness of 100 nm, and the infrared reflection layer facing the environment has a thickness of 10 nm.

16. A preparation method for an augmented reality optical lens with eye protection function according to claim 15, comprising:

- S00, inputting optimization objectives into simulation software, comprising visible light transmittance and infrared emissivity;
- S10, inputting an initial structure, establishing a model of a lens, optimizing a thickness of each layer using the simulation software to obtain a final optimized thickness of each layer of the lens, thereby obtaining final design values; and
- S20, depositing materials sequentially on a substrate according to the final design values using a thin film deposition method.

17. The preparation method according to claim 16, wherein the materials are sequentially deposited on the substrate according to the final design values through electron beam evaporation coating or magnetron sputtering coating.

18. A preparation method for an augmented reality optical lens with eye protection function according to claim 14, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

19. The preparation method according to claim 18, wherein the materials are sequentially deposited on the substrate according to the final design values through electron beam evaporation coating or magnetron sputtering coating.

20. The augmented reality optical lens with eye protection function according to claim 1, wherein the infrared reflection layers are made of indium tin oxide, with a layer count ranging from 1 to 10 and each layer having a thickness ranging from 5 nm to 500 nm.

21. The augmented reality optical lens with eye protection function according to claim 20, wherein the infrared reflection layer facing the human eye has a thickness of 100 nm, and the infrared reflection layer facing the environment has a thickness of 10 nm.

22. A preparation method for an augmented reality optical lens with eye protection function according to claim 21, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

23. The preparation method according to claim 22, wherein the materials are sequentially deposited on the substrate according to the final design values through electron beam evaporation coating or magnetron sputtering coating.

24. A preparation method for an augmented reality optical lens with eye protection function according to claim 20, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

25. The preparation method according to claim 24, wherein the materials are sequentially deposited on the substrate according to the final design values through electron beam evaporation coating or magnetron sputtering coating.

26. The augmented reality optical lens with eye protection function according to claim 1, wherein the thermally conductive tape is made of graphene or copper tape.

27. The augmented reality optical lens with eye protection function according to claim 26, wherein the infrared reflection layer facing the human eye has a thickness of 100 nm, and the infrared reflection layer facing the environment has a thickness of 10 nm.

28. A preparation method for an augmented reality optical lens with eye protection function according to claim 27, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

29. The preparation method according to claim 28, wherein the materials are sequentially deposited on the substrate according to the final design values through electron beam evaporation coating or magnetron sputtering coating.

30. A preparation method for an augmented reality optical lens with eye protection function according to claim 26, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

31. The preparation method according to claim 30, wherein the materials are sequentially deposited on the substrate according to the final design values through electron beam evaporation coating or magnetron sputtering coating.

32. The augmented reality optical lens with eye protection function according to claim 1, wherein the infrared reflection layer facing the human eye has a thickness of 100 nm, and the infrared reflection layer facing the environment has a thickness of 10 nm.

33. A preparation method for an augmented reality optical lens with eye protection function according to claim 32, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

34. The preparation method according to claim 33, wherein the materials are sequentially deposited on the substrate according to the final design values through electron beam evaporation coating or magnetron sputtering coating.

35. A preparation method for an augmented reality optical lens with eye protection function according to claim 1, comprising:

S00, inputting optimization objectives into simulation software, comprising visible light transmittance and infrared emissivity;

S10, inputting an initial structure, establishing a model of a lens, optimizing a thickness of each layer using the simulation software to obtain a final optimized thickness of each layer of the lens, thereby obtaining final design values; and S20, depositing materials sequentially on a substrate according to the final design values using a thin film deposition method.

36. The preparation method according to claim 35, wherein the materials are sequentially deposited on the substrate according to the final design values through electron beam evaporation coating or magnetron sputtering coating.

* * * * *